United States Patent
Yuan et al.

(10) Patent No.: US 9,536,778 B2
(45) Date of Patent: Jan. 3, 2017

(54) SELF-ALIGNED DOUBLE PATTERNING PROCESS FOR METAL ROUTING

(71) Applicant: GLOBALFOUNDRIES Inc., Grand Cayman (KY)

(72) Inventors: Lei Yuan, Cupertino, CA (US); Jongwook Kye, Pleasanton, CA (US); Harry J Levinson, Saratoga, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/679,060

(22) Filed: Apr. 6, 2015

(65) Prior Publication Data

US 2016/0293478 A1  Oct. 6, 2016

(51) Int. Cl.
*H01L 23/528* (2006.01)
*H01L 21/768* (2006.01)
*H01L 21/311* (2006.01)
*H01L 21/027* (2006.01)
*H01L 23/532* (2006.01)

(52) U.S. Cl.
CPC ..... *H01L 21/76802* (2013.01); *H01L 21/0273* (2013.01); *H01L 21/31144* (2013.01); *H01L 21/76877* (2013.01); *H01L 23/528* (2013.01); *H01L 23/53228* (2013.01); *H01L 23/53257* (2013.01)

(58) Field of Classification Search
CPC .................. H01L 21/31144; H01L 21/76808; H01L 21/76816; H01L 23/528
See application file for complete search history.

(56) References Cited

U.S. PATENT DOCUMENTS

| | | | | |
|---|---|---|---|---|
| 8,318,603 B2* | 11/2012 | Lee | ...................... | H01L 21/0337 438/700 |
| 9,036,404 B2* | 5/2015 | Liaw | ...................... | G11C 11/412 365/154 |
| 9,245,766 B2* | 1/2016 | Wang | ................ | H01L 27/11524 |
| 2012/0058640 A1* | 3/2012 | Kim | ...................... | H01L 21/0337 438/675 |
| 2014/0282289 A1* | 9/2014 | Hsu | ...................... | G03F 7/70433 716/51 |
| 2014/0282344 A1* | 9/2014 | Hsu | ...................... | G06F 17/5072 716/123 |
| 2016/0049307 A1* | 2/2016 | Chen | ................ | H01L 21/31111 438/696 |

* cited by examiner

*Primary Examiner* — Allen Parker
*Assistant Examiner* — Stephen Bradley
(74) *Attorney, Agent, or Firm* — Ditthavong & Steiner, P.C.

(57) ABSTRACT

Self-aligned double patterning processes to produce metal route between and connecting conductive lines are disclosed. Embodiments include forming a hard mask over a dielectric layer; forming a patterning template including plural parallel linear elements on the hard mask, wherein said hard mask is exposed between adjacent parallel linear elements; forming a block mask covering a portion of said adjacent parallel linear elements and spaces therebetween; etching exposed portions of said hard mask through said block mask and said patterning template defining plural parallel lines; removing said block mask and said patterning template; forming a cut mask above said hard mask to define an opening perpendicular to and connecting two adjacent parallel lines; etching said hard mask through said cut mask and removing the cut mask; etching recesses in the dielectric layer through said hard mask; removing the hard mask; and filling said recesses with a conductive material.

16 Claims, 5 Drawing Sheets

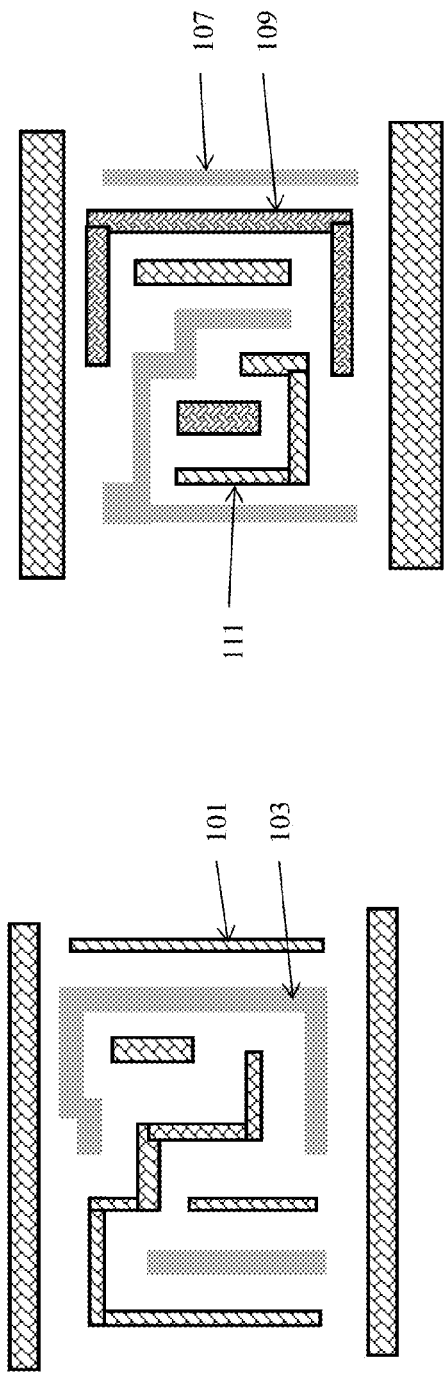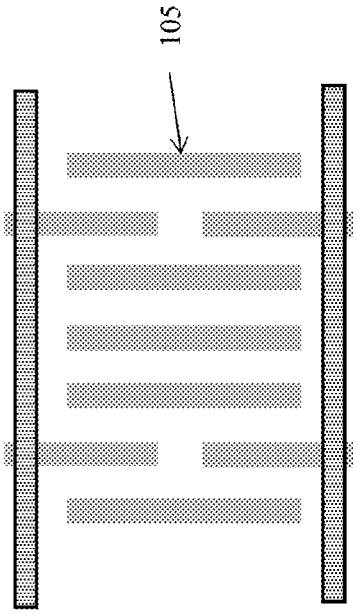
FIG. 1A
PRIOR ART
FIG. 1B
PRIOR ART
FIG. 1C
PRIOR ART

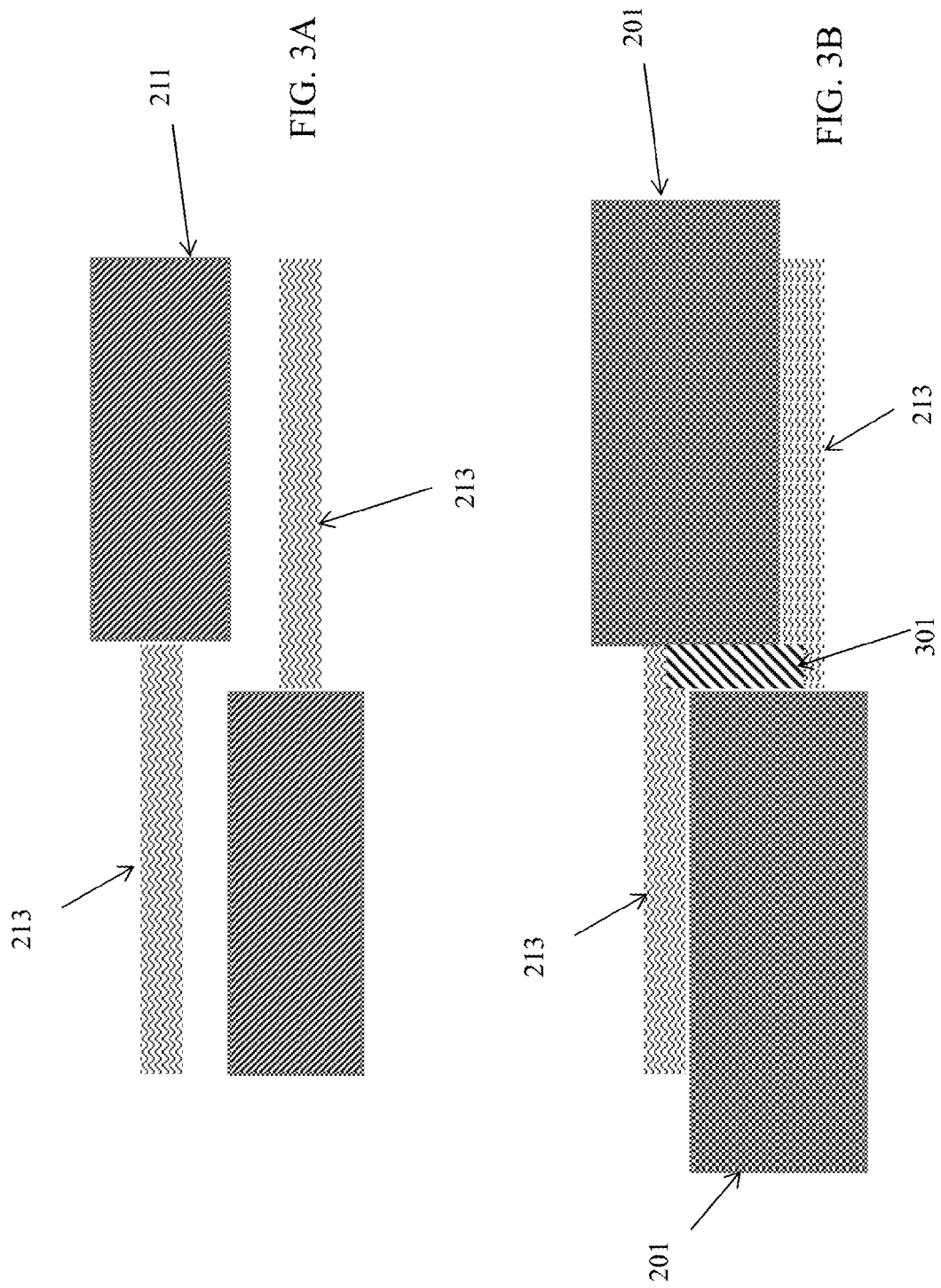

SELF-ALIGNED DOUBLE PATTERNING PROCESS FOR METAL ROUTING

TECHNICAL FIELD

The present disclosure relates to the manufacture of semiconductor devices, and, more specifically, to a self-aligned double patterning (SADP) process to produce a metal route between conductive lines. The present disclosure is particularly applicable to devices for the 7 nanometer (nm) technology node and beyond.

BACKGROUND

Photolithography is a basic process used in manufacturing integrated circuits. In summary, photolithography involves forming a layer of light or radiation-sensitive material, such as photoresist, above a layer of material or a substrate. The radiation-sensitive material is selectively exposed to a light generated by a light source (such as a deep ultraviolet or extreme ultraviolet source) to transfer a pattern defined by a mask to the radiation-sensitive material. The exposed layer of radiation-sensitive material is developed to define a patterned mask layer. Various process operations, such as etching or ion implantation processes, may then be performed on the underlying layer of material or substrate through the patterned mask layer.

An objective of integrated circuit fabrication is to faithfully reproduce the original circuit design on the integrated circuit product. Historically, the feature sizes and pitches employed in integrated circuit products were such that a desired pattern could be formed using a single patterned photoresist masking layer. However, in recent years, device dimensions and pitches have been reduced to the point where existing photolithography tools, e.g., 193 nm wavelength immersion photolithography tools, cannot form a single patterned mask layer with all of the features of the overall target pattern. Accordingly, designers have resorted to techniques that involve performing multiple exposures to define a single target pattern in a layer of material. One such technique is generally referred to as multiple patterning, e.g., double patterning. In general, double patterning is an exposure method that involves splitting (i.e., dividing or separating) a dense overall target circuit pattern into two separate, less-dense patterns. The simplified, less-dense patterns are then printed separately on a wafer utilizing two separate masks (where one of the masks is utilized to image one of the less-dense patterns, and the other mask is utilized to image the other less-dense pattern). This technique effectively lowers the complexity of the photolithography process, improving the achievable resolution and enabling the printing of far smaller features that would otherwise be impossible using existing photolithography tools. Litho-etch-litho-etch (LELE) is one such multiple patterning technique. As illustrated in FIG. 1A, the pattern cannot be formed with a single mask, but rather is broken into two patterns 101 and 103. Each pattern is assigned a different color, where design rules are satisfied within each color. However, LELE requires careful alignment between the two masks.

A SADP process has been developed to overcome the alignment issues. For SADP, a pattern of mandrels is formed on a substrate, a spacer material is deposited on side surfaces of the mandrels, and the mandrels are removed. A block mask may be used to isolate portions not to be etched. The resulting pattern formed by the spacers has twice as many elements as the mandrel pattern. Therefore, SADP is an attractive solution for manufacturing next-generation devices, particularly metal routing lines on such next-generation devices, due to better overlay control that is possible when using an SADP process. Metal lines that are defined by mandrel patterns are often called mandrel metals while other metal lines are called non-mandrel metals. Mandrel metals and non-mandrel metals are often referred by two color metal lines. In SADP technology, two color metal lines are always separated by either spacer material or block mask so that they cannot overlap. In another word, metal stitching is not possible in conventional SADP technology.

In placement and route technology, a metal stub route that connects metal lines of two abutting cells is an efficient technique to improve the metal routing efficiency and chip scaling, as well as circuit performance. In double patterning technology, such as LELE for 20 nm design, or triple patterning, such as LELELE for 10 nm design, shown by patterns 107, 109, and 111 in FIG. 1C, a metal stub route requires a stitch to resolve color conflict between adjacent lines. However, 7 nm designs require SADP technology, but a metal stub route is not an option for SADP technology because stitching is not permitted in a SADP process.

A need therefore exists for SADP methodology enabling the formation of a metal stub route between adjacent metal lines.

SUMMARY

An aspect of the present disclosure is to enable metal stub route formation utilizing SADP technology to improve route efficiency, chip scaling and circuit performance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a hard mask over a dielectric layer; forming a patterning template including a plurality of parallel linear elements disposed on the hard mask, wherein the hard mask is exposed between adjacent parallel linear elements; forming a block mask covering a portion of the adjacent parallel linear elements and spaces between the adjacent parallel linear elements; etching exposed portions of the hard mask through the block mask and the patterning template defining plural parallel lines; removing the block mask and the patterning template; forming a cut mask above the hard mask to define an opening perpendicular to and connecting two adjacent parallel lines; etching the hard mask through the cut mask and removing the cut mask; etching recesses in the dielectric layer through the hard mask; removing the hard mask; and filling the recesses with a conductive material.

Aspects include forming said patterning template by forming mandrels above said hard mask with spacers on opposite sidewalls of each mandrel, and removing the mandrels. Further aspects include said plurality of parallel linear elements being spaced evenly apart. Other aspects include forming the block mask by covering a first half of a space corresponding to one of the adjacent parallel lines and a second half of a space corresponding to a second of the adjacent parallel lines. Additional aspects include etching said recesses in the dielectric layer corresponding to said adjacent parallel lines and said opening. Another aspect includes said block mask including a first photoresist mask, and said cut mask including a second photoresist mask. A further aspect includes etching of said hard mask layer through said block mask occurring prior to said etching of said hard mask layer through said cut mask. Another aspect includes forming said cut mask further defining a power line perpendicular to and at an end of the two adjacent parallel lines. Other aspects include filling said recesses with copper or tungsten. Additional aspects include the adjacent parallel lines being in adjacent cells.

Another aspect of the present disclosure is a method including forming a hard mask over a dielectric layer; forming mandrels above the hard mask with spacers on opposite sidewalls of each mandrel, said spacers defining plural parallel lines therebetween; removing said mandrels; forming a block mask covering portions of said plural parallel lines; etching portions of said hard mask exposed through said block mask and said spacers; removing said block mask and said spacers; forming a cut mask above said hard mask to define an opening disposed perpendicular to and connecting first and second lines of said plural parallel lines; etching said hard mask through said cut mask; removing the cut mask; etching recesses in the dielectric layer, said recesses corresponding to said plural parallel lines and said opening; removing the hard mask; and filling said recesses with a conductive material.

Aspects include the block mask including a first photoresist mask and the cut mask including a second photoresist mask. Further aspects include the adjacent parallel lines being in adjacent cells. Another aspect including etching the hard mask layer through said block mask occurring prior to the etching of said hard mask layer through said cut mask. Other aspects include forming said cut mask further defining a power line perpendicular to and at an end of the parallel lines. Additional aspects include forming the block mask including covering a first half portion of a space corresponding to one of the adjacent parallel lines and a second half portion of a space corresponding to a second of the adjacent parallel lines. A further aspect includes said cut mask being formed between said first and second half portions of the spaces corresponding to the parallel lines. Another aspect includes said mandrels being spaced evenly apart. An additional aspect includes said mandrels including a one dimensional pattern.

Yet another aspect of the present disclosure is a method including forming a hard mask over a dielectric layer; forming mandrels above the hard mask with spacers on opposite sidewalls of each mandrel, said spacers defining plural parallel lines therebetween; removing said mandrels; forming a photoresist block mask covering portions of said plural parallel lines; etching portions of said hard mask exposed through said block mask and said spacers; removing said first photoresist block mask and said spacers; forming a photoresist cut mask above said photoresist hard mask to define: an opening disposed perpendicular to and connecting first and second lines of said plural parallel lines, and a power line perpendicular to and at an end of the parallel lines; etching said hard mask through said cut mask; removing the cut mask; etching recesses in the dielectric layer corresponding to said plural parallel lines, said opening and power line; removing the hard mask; and filling said recesses with a conductive material.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 1B schematically illustrate conventional layouts for LELE and LELELE, respectively, and FIG. 1C schematically illustrates a conventional layout of metal lines formed by SADP;

FIGS. 3A and 3B schematically illustrate top plan views of process steps for forming an interconnect structure such as a metal stub route using a cut mask with SADP, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the inability to form metal jogs or stub routes between different color conducive lines attendant upon using SADP. Methodology in accordance with embodiments of the present disclosure includes applying a cut mask subsequent to applying a block mask during an SADP process to create an interconnect structure such as a metal stub route between conductive lines of different color and effectively resolve color conflict between the adjacent lines.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2C:
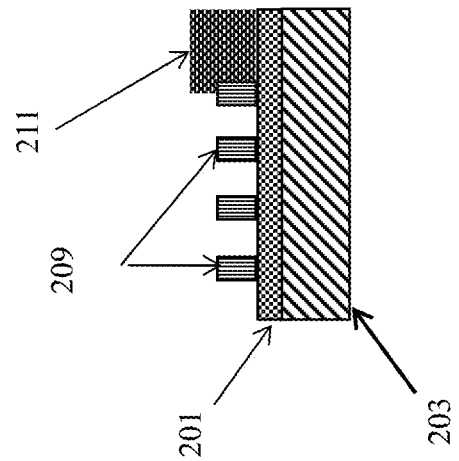
FIGS. 2A through 2F schematically illustrate cross sectional views of a process flow for forming metal lines with a metal interconnect structure such as a metal stub route using SADP, in accordance with an exemplary embodiment.
Figure 2B:
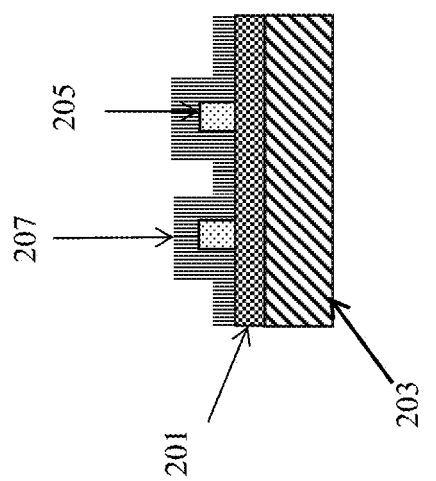
Figure 2A:
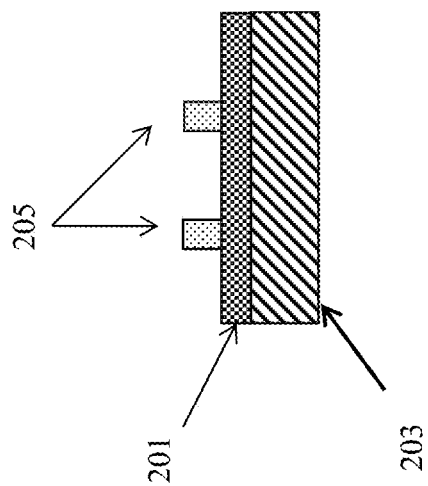

Attention is directed to FIG. 2A which illustrates a hard mask 201 formed on a surface of dielectric layer 203. Dielectric layer 203 is comprised, for example, of a low-k dielectric material, a dielectric material having a dielectric constant of approximately 2.7 or higher or an ultra-low-k (ULK) material, a dielectric material having a dielectric constant of approximately 2.5 or lower. The hard mask 201 is comprised, for example, of a silicon nitride, spin on carbon, etc.

A patterning template is formed over the hard mask 201 by first forming a plurality of parallel elements 205 disposed on the hard mark 201. The parallel elements include, for example, mandrels that are formed above the hard mask layer 201 in an evenly spaced one dimensional pattern, with portions of the hard mask 201 exposed between the adjacent mandrels 205. Other layers may be formed below the patterning template, such as an anti-reflective coating (ARC) layer (not shown for illustrative convenience). As shown in FIG. 2B, a spacer layer 207 is disposed over the parallel elements 205. Spacer layer may be formed of, for example, silicon dioxide, and is deposited over the parallel elements 205 by way of a deposition process.

An anisotropic etch process, such as a dry etch process, is next performed to define spacers 209 on opposite sidewalls of each of the parallel elements 205. Then, an etch process is performed to remove the parallel elements 205 selectively to the spacers and the hard mask 201. The pitch of the sidewall spacers is twice the pitch of the mandrels or parallel elements. As shown FIG. 2C, the spacers 209 define openings exposing the hard mask layer 201. FIG. 2C illustrates the completed patterning template after a block mask 211 (e.g., a first photoresist mask) is formed. The block mask 211 covers a portion of adjacent parallel linear elements and spaces between the adjacent parallel linear elements (i.e., spacers) 209.

Figure 2E:
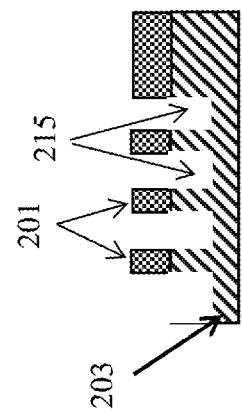
Figure 2D:
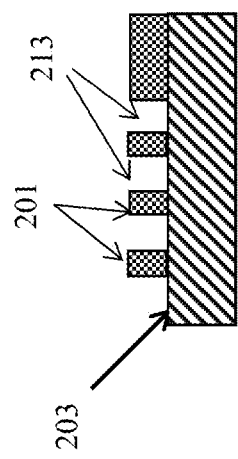

Adverting to FIG. 2D, hard mask 201 is anisotropically etched through the spacers 209 and the block mask 211 to partially pattern the hard mask layer 201. An ashing process may then be performed to remove the block mask 211, and an etch process may be performed to remove the spacers 209 selectively to the hard mask layer 201. This operation results in the formation of a partially patterned hard mask layer 201 including a plurality of parallel line segment openings 213 that expose corresponding underlying portions of the dielectric layer 203 beneath the partially patterned hard mask layer 201. The openings 213 correspond to the locations where the parallel conductive lines will be formed in the dielectric layer 203 beneath the hard mask 201.

Attention is now directed to FIGS. 3A and 3B for top plan views illustrating an exemplary process of the present application. In particular, prior to the ashing process to remove the block mask 211 described above, FIG. 3A illustrates the block mask 211 covering a portion of adjacent spaces 213. In this non-limiting example, the block mask 211 covers a first half of one of the adjacent parallel spaces 213, and a second half of the second adjacent space 213. Note that between spaces 213 are portions of the hard mask layer 201 that were under spacers 209 and, therefore, have not been etched. The position of the block mask at the end, middle, or another position along the parallel spaces depends on the intended pattern layout. It is noted that the adjacent spaces 213 illustrated in FIGS. 3A and 3B correspond to two parallel conductive lines that are to be formed in the dielectric layer 203.

FIG. 3B illustrates the hard mask 201 after forming a cut mask (e.g., second photoresist) with an opening 301 above the partially patterned hard mask layer 201. The cut mask is disposed over the hard mask 201 to define an opening 301 perpendicular to and connecting the two adjacent parallel spaces 213, forming a jog. The cut mask covers the previously formed openings in the partially patterned hard mask layer 201 and contains an opening that exposes the hard mask layer 201 in a location corresponding to where a perpendicular line will be formed in the dielectric layer 203 between two parallel conductive lines. Alternatively, there may be no block mask 211 covering portions of the spaces 213. Then, the cut mask may have an opening corresponding to a location for connecting parallel lines from adjacent cells. This perpendicular line opening corresponds to where the conductive interconnect (i.e., metal stub route or "stich") is formed between two parallel conductive lines. See e.g., stitch 401 in FIG. 4. The cut mask can also be formed to define one or more power lines/rails positioned at the end(s) of the conductive lines.

Figure 4:
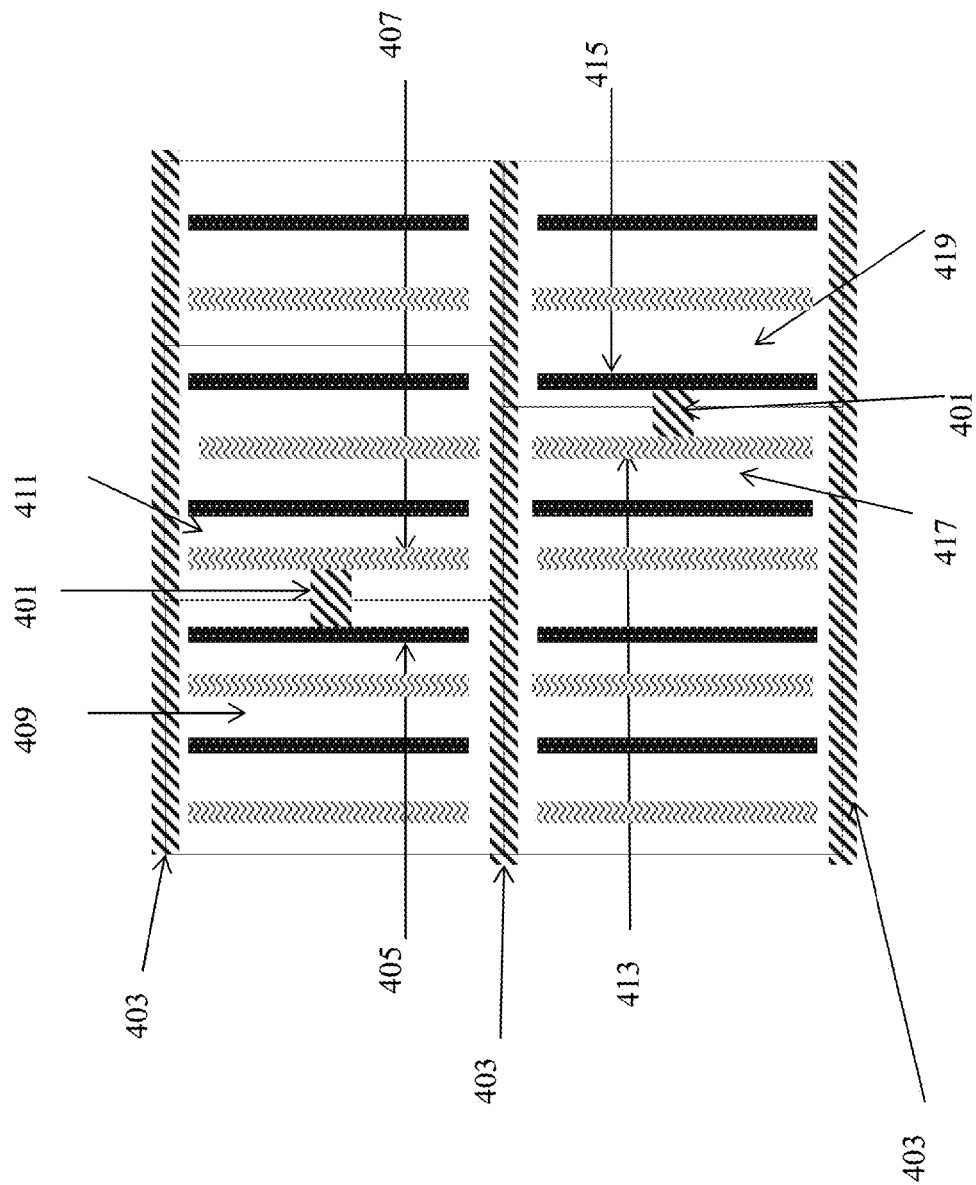
FIG. 4 schematically illustrates an additional top plan view illustrating metal lines and an interconnect structure resulting from the processes of FIGS. 2A through 2F and 3A and 3B, in accordance with an exemplary embodiment.

FIG. 4 illustrates a standard design cell array including multiple stub routes formed between conductive lines formed at the edges of two different cells of the array. Power lines/rails 403 are formed at the ends of the conductive lines. In FIG. 4, one of the stub routes 401 joins two conductive lines 405 and 407, which are formed in two different cells 409 and 411, respectively. The second stub route 401 in this example joins two conductive lines 413 and 415 are formed in two different cells 417 and 419, respectively. Conductive lines 413 and 417 represent mandrel lines (and are represented by a first color), and conductive lines 405 represent non-mandrel lines (and 415 are represented by a second color). All of the conductive lines are filled with a metal such as copper or tungsten.

Attention is now directed back to FIG. 2E which is a cross-sectional view illustrating a fully patterned hard mask layer 201 after an etching process was performed through the cut mask (FIG. 3B) and the cut mask has been removed. The fully patterned hard mask layer 201 includes the line openings or recesses 215 in the dielectric layer 203, and a perpendicular line opening (not shown in the cross-sectional view) corresponding to the openings in the cut mask. An anisotropic etch process is performed through the openings in the fully patterned hard mask layer 201 to etch the dielectric layer 203 to define corresponding recesses 215 therein.

Figure 2F:
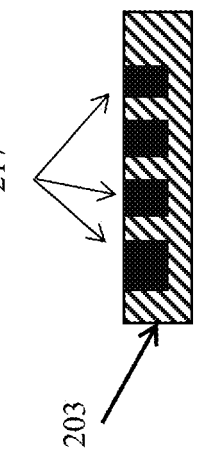

One or more deposition processes are performed so as to over-fill the recesses 215 with a conductive material 217. Then, as shown in FIG. 2F a planarization process is performed to remove excess conductive material 217 and the fully patterned hard mask layer 201. The conductive material 217 may include multiple layers, such as one or more barrier layers (e.g., Ta, TaN, TiN, etc.) to prevent metal migration into the dielectric layer 203, a metal seed layer (e.g., copper), and a metal fill material (e.g., copper or tungsten).

The embodiments of the present disclosure can achieve several technical effects, such as formation of stitches and jogs with SADP processes. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices by way of a self-aligned double patterning process, particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method, comprising:
    forming a hard mask over a dielectric layer;
    forming a patterning template including a plurality of parallel linear elements disposed on the hard mask, wherein said hard mask is exposed between adjacent parallel linear elements;
    forming a block mask covering a portion of said adjacent parallel linear elements and spaces between said adjacent parallel linear elements;
    etching exposed portions of said hard mask through said block mask and said patterning template defining plural parallel lines;
    removing said block mask and said patterning template;
    forming a cut mask above said hard mask to define an opening perpendicular to and connecting two adjacent parallel lines, wherein forming said cut mask further defines a power line perpendicular to and at an end of the two adjacent parallel lines;
    etching said hard mask through said cut mask and removing the cut mask;
    etching recesses in the dielectric layer through said hard mask;
    removing the hard mask; and
    filling said recesses with a conductive material.

2. The method of claim 1, wherein forming said patterning template comprises:
    forming mandrels above said hard mask with spacers on opposite sidewalls of each mandrel, and removing the mandrels.

3. The method of claim 1, wherein said plurality of parallel linear elements are spaced evenly apart.

4. The method of claim 1, wherein forming the block mask includes covering a first portion of a space corresponding to one of the adjacent parallel lines and a second portion of a space corresponding to a second of the adjacent parallel lines.

5. The method of claim 1, wherein etching said recesses in the dielectric layer corresponds to said adjacent parallel lines and said opening.

6. The method of claim 1, wherein said block mask comprises a first photoresist mask, and said cut mask comprises a second photoresist mask.

7. The method of claim 1, wherein etching of said hard mask layer through said block mask occurs prior to said etching of said hard mask layer through said cut mask.

8. The method of claim 1, wherein filling said recesses includes filling said recesses with copper or tungsten.

9. A method, comprising:
    forming a hard mask over a dielectric layer;
    forming mandrels above the hard mask with spacers on opposite sidewalls of each mandrel, said spacers defining plural parallel lines therebetween;
    removing said mandrels;
    forming a block mask covering portions of said plural parallel lines;
    etching portions of said hard mask exposed through said block mask and said spacers;
    removing said block mask and said spacers;
    forming a cut mask above said hard mask to define an opening disposed perpendicular to and connecting first and second lines of said plural parallel lines, wherein forming said cut mask further defines a power line perpendicular to and at an end of the parallel lines;
    etching said hard mask through said cut mask;
    removing the cut mask;
    etching recesses in the dielectric layer, said recesses corresponding to said plural parallel lines and said opening;
    removing the hard mask; and
    filling said recesses with a conductive material.

10. The method of claim 9, wherein said block mask comprises a first photoresist mask and said cut mask comprises a second photoresist mask.

11. The method of claim 9, wherein etching said hard mask layer through said block mask occurs prior to said etching of said hard mask layer through said cut mask.

12. The method of claim 9, wherein forming the block mask includes covering a first portion of a space corresponding to one of the adjacent parallel lines and a second portion of a space corresponding to a second of the adjacent parallel lines.

13. The method of claim 12, wherein said cut mask is formed between said first and second portions.

14. The method of claim 9, wherein said mandrels are spaced evenly apart.

15. The method of claim 9, wherein said mandrels comprise a one dimensional pattern.

16. A method, comprising:
    forming a photoresist hard mask over a dielectric layer;
    forming mandrels above the hard mask with spacers on opposite sidewalls of each mandrel, said spacers defining plural parallel lines therebetween;
    removing said mandrels;
    forming a photoresist block mask covering portions of said plural parallel lines;
    etching portions of said hard mask exposed through said block mask and said spacers;
    removing said first photoresist block mask and said spacers;
    forming a photoresist cut mask above said photoresist hard mask to define:
    an opening disposed perpendicular to and connecting first and second lines of said plural parallel lines, and
    a power line perpendicular to and at an end of the parallel lines;
    etching said hard mask through said cut mask;
    removing the cut mask;
    etching recesses in the dielectric layer corresponding to said plural parallel lines, said opening and power line;
    removing the hard mask; and
    filling said recesses with a conductive material.

* * * * *